United States Patent
Xue et al.

(10) Patent No.: US 9,679,833 B2
(45) Date of Patent: Jun. 13, 2017

(54) SEMICONDUCTOR PACKAGE WITH SMALL GATE CLIP AND ASSEMBLY METHOD

(71) Applicant: Alpha and Omega Semiconductor Incorporated, Sunnyvale, CA (US)

(72) Inventors: Yan Xun Xue, Los Gatos, CA (US); Hamza Yilmaz, Gilroy, CA (US); Yueh-Se Ho, Sunnyvale, CA (US); Jun Lu, San Jose, CA (US); Ming-Chen Lu, Shanghai (CN); Hongtao Gao, Shanghai (CN)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 0 days.

(21) Appl. No.: 15/261,702

(22) Filed: Sep. 9, 2016

(65) Prior Publication Data
US 2016/0379918 A1  Dec. 29, 2016

Related U.S. Application Data

(60) Continuation of application No. 14/849,604, filed on Sep. 10, 2015, now Pat. No. 9,472,491, which is a
(Continued)

(51) Int. Cl.
*H01L 23/48* (2006.01)
*H01L 23/495* (2006.01)
(Continued)

(52) U.S. Cl.
CPC .... *H01L 23/49562* (2013.01); *H01L 21/4825* (2013.01); *H01L 21/565* (2013.01); *H01L 23/3114* (2013.01); *H01L 23/492* (2013.01);
*H01L 23/49503* (2013.01); *H01L 23/49517* (2013.01); *H01L 23/49541* (2013.01); *H01L 23/49551* (2013.01); *H01L 23/49575* (2013.01); *H01L 24/40* (2013.01); *H01L 23/49537* (2013.01); *H01L 2224/0603* (2013.01); *H01L 2224/32245* (2013.01);
(Continued)

(58) Field of Classification Search
CPC ......... H01L 23/49575; H01L 23/49537; H01L 21/67144
USPC .......................... 257/690, 673, 773, E23.086
See application file for complete search history.

(56) References Cited

U.S. PATENT DOCUMENTS

2015/0206830 A1* 7/2015 Takada .............. H01L 23/49562
257/676

* cited by examiner

*Primary Examiner* — Tan N Tran
(74) *Attorney, Agent, or Firm* — Chen-Chi Lin

(57) ABSTRACT

A method of manufacturing a semiconductor package having a small gate clip is disclosed. A first and second semiconductor chips, each of which includes a source electrode and a gate electrode at a top surface, are attached on two adjacent lead frame units of a lead frame such that the lead frame unit with the first chip formed thereon is rotated 180 degrees in relation to the other lead frame unit with the second semiconductor chip formed thereon. A first and second clip sets are mounted on the first and second semiconductor chips, wherein the first clip set is connected to the gate electrode of the first chip, the source electrode of the second chip, and their corresponding leads and the second clip set is connected to the gate electrode of the second chip, the source electrode of the first chip and their corresponding leads.

5 Claims, 9 Drawing Sheets

Related U.S. Application Data division of application No. 14/502,902, filed on Sep. 30, 2014, now Pat. No. 9,171,788.

(51) Int. Cl.
*H01L 23/00* (2006.01)
*H01L 23/492* (2006.01)
*H01L 21/48* (2006.01)
*H01L 21/56* (2006.01)
*H01L 23/31* (2006.01)

(52) U.S. Cl.
CPC ............ *H01L 2224/40095* (2013.01); *H01L 2224/40139* (2013.01); *H01L 2224/40245* (2013.01); *H01L 2224/48247* (2013.01); *H01L 2224/73265* (2013.01); *H01L 2924/13055* (2013.01); *H01L 2924/13091* (2013.01); *H01L 2924/181* (2013.01)

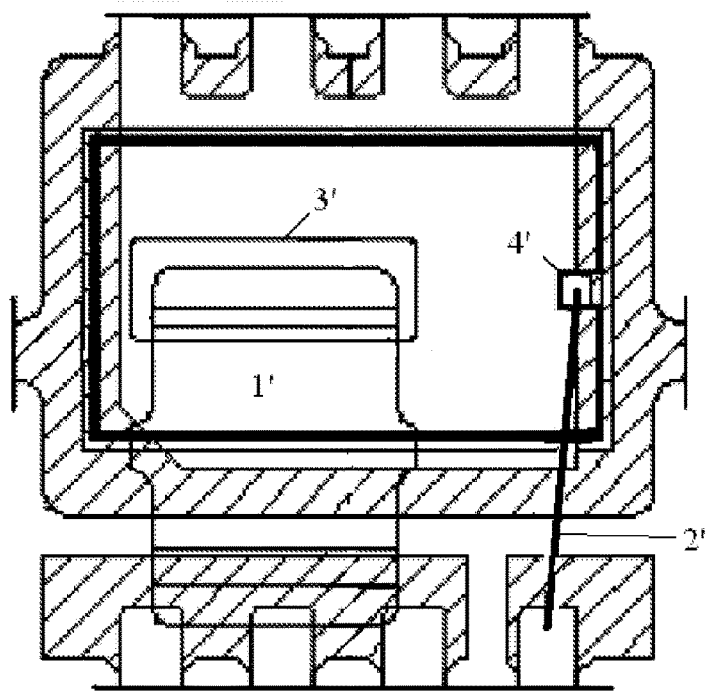
FIG. 1 – Prior Art
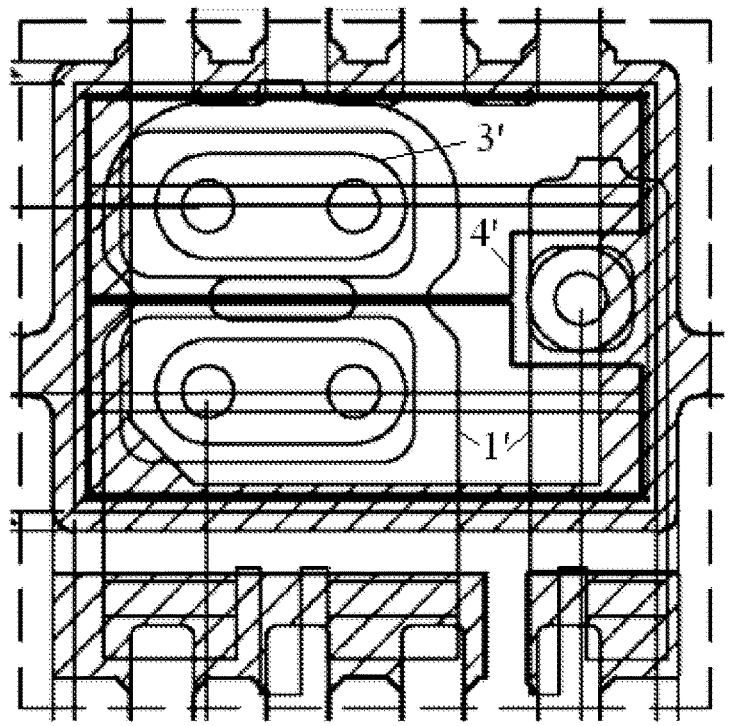
FIG. 2 – Prior Art

US 9,679,833 B2

SEMICONDUCTOR PACKAGE WITH SMALL GATE CLIP AND ASSEMBLY METHOD

CROSS-REFERENCE TO RELATED APPLICATIONS

This Patent Application is a Continuation of a pending application Ser. No. 14/849,604 filed on Sep. 10, 2015. The pending application Ser. No. 14/849,604 is a Divisional application of an application Ser. No. 14/502,902 filed on Sep. 30, 2014 that is issued as a patent U.S. Pat. No. 9,171,788. The Disclosure made in the patent application Ser. Nos. 14/849,604 and 14/502,902 are hereby incorporated by reference.

FIELD OF PRESENT INVENTION

The present invention relates to a semiconductor packaging technology, and in particular relates to a semiconductor package with a small gate clip and a packaging method thereof.

BACKGROUND OF RELATED ART

In the process of manufacturing a semiconductor device, in order to achieve a higher current and a lower resistance, metal clips such as copper clips are widely used in power devices. As shown in FIG. 1, both clip bonding and wire bonding are used for source and gate connections in a semiconductor device. A metal clip 1' is commonly used for the connection of a source electrode 3' on the semiconductor chip to a lead while a wire bonding is commonly used to connect a gate electrode 4' on the semiconductor chip to another lead. However, in practical applications, using both wire bonding and clip bonding on the same semiconductor device results in a more complicated process and low production yield. In addition, wire bonding cannot support a large current and at high frequencies and the length of the wire affects the inductance of the semiconductor.

Conventional technology has used metal clips 1' for the connection of both source electrode 3' and gate electrode 4' on the same semiconductor as shown in FIG. 2. However, to support this technique, a larger clip is needed for the gate connection hence resulting in a big gate opening for soldering, which leaves some residue that is difficult to clean and will affect the wiring in between layers of the device during the manufacturing process.

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention:

FIG. 1 is a schematic view of a prior art package structure using both wire bonding and clip bonding for source and gate connections.

FIG. 2 is a schematic view of a prior art package structure using only clip bonding for both source and gate connections.

DESCRIPTION OF THE SPECIFIC EMBODIMENTS

In conjunction with the accompanying drawings, the specific embodiments of the present invention are further described below.

Figure 3:
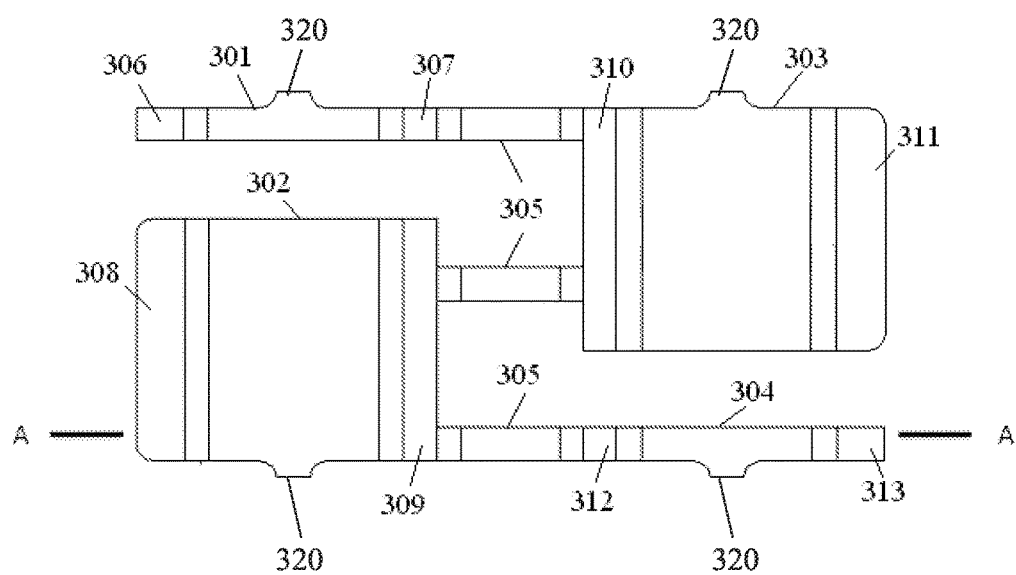
FIG. 3 is a top view of a clip structure according to the first embodiment of the present invention.

FIG. 3 is a top view of a clip frame structure according to a first embodiment of the present invention. The clip frame structure includes two identical clip sets placed side by side with one clip set being inverted, i.e., rotated 180 degrees, in relation to the other, thus constituting as a rotational symmetry of order 2 image of each other. The first clip set includes a gate clip 301 and a source clip 303 connected together by a first tie bar 305. The second clip set includes a source clip 302 and a gate clip 304 connected together by a second tie bar 305.

The first and second clip sets are connected together by a third tie bars 305, where the source clip 302 is connected to the source clip 303 through the third tie bar 305. In the first embodiment of the present invention, the width of the tie bars 305 is less than or equal to the width of the gate clip. Through the tie bars 305, the shape of the clip structure becomes S-shaped or reverse S-shaped.

As mentioned above, the first clip set and the second clip set are inverted in relation to each other, where the gate clip 301 is parallel to and separated from the source clip 302, and the source clip 303 is parallel to and separated from gate clip 304. Further, protrusions 320 on the edges of the gate clip 301, the source clip 302, the source clip 303 and the gate clip 304 are used for connecting to adjacent clip frame structures.

Figure 4:
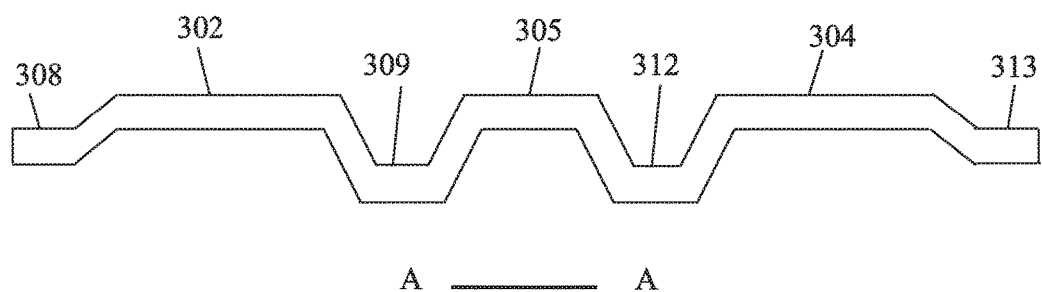
FIG. 4 is a cross-sectional view of the clip structure in FIG. 3 along a line A-A.

FIG. 4 is a cross-sectional view of the clip structure of FIG. 3 along a line A-A, specifically is the cross-sectional view of the second clip set including the source clip 302 electrically connected to the gate clip 304 through a tie bar 305. The source clip 302 comprises a source electrode contact area 308 at one end electrically connected to a source lead contact area 309 at the other end while the gate clip 304 comprises a gate electrode contact area 313 at one end electrically connected to a gate lead contact area 312 at the other end. The source lead contact area 309 adjacent the tie bar 305 is used for connecting to a source lead of a lead frame, and the gate lead contact area 312 adjacent the tie bar 305 is used for connecting to a gate lead of the lead frame. The source electrode contact area 308 connected to the outer end of the source clip 302 is used for connecting to a source electrode of a first semiconductor chip, and the gate electrode contact area 313 connected to the outer end of the gate clip 304 is used for connecting to a gate electrode of a second semiconductor chip, which will be described in detail later. The source lead contact area 309 and the gate lead contact area 312 are located in a first plane, and the lead 308 and 313 are located in a second plane, where the first plane of the source lead 309 and the gate lead 312 is lower than the second plane of the lead 308 and the lead 313.

The cross-sectional view of the first clip set including the gate clip 301 and the source clip 303 connecting together by a tie bar 305 is similar as that of the second clip set described in FIG. 4. The gate lead contact area 307 adjacent the tie bar 305 is used for connecting to a gate lead of the lead frame. The source lead contact area 310 adjacent the tie bar 305 is used for connecting to a source lead of the lead frame. The gate electrode contact area 306 connected to the outer end of the gale clip 301 is used for connecting to a gate electrode of the first semiconductor chip. The source electrode contact area 311 connected to the outer end of the source clip 303 is used for connecting to a source electrode of the second semiconductor chip, which will be described in detail later.

Figure 5:
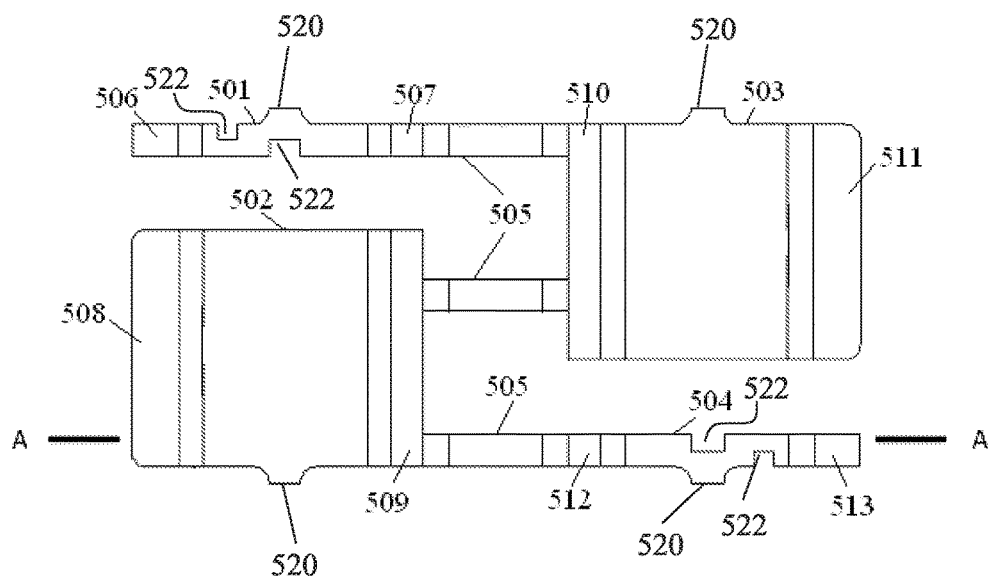
FIG. 5 is a top view of another clip structure according to the second embodiment of the present invention.

FIG. 5 illustrates a top view of another clip frame structure according to a second embodiment of the present invention. The clip frame structure can be made of a metal such as copper and includes two identical clip sets placed side by side with one clip set being inverted in relation to the other, thus constituting as a rotational symmetry of order 2 image of each other. The first clip set includes a gate clip 501 and a source clip 503 connected together by a first tie bar 505. The second clip set includes a source clip 502 and a gate clip 504 connected together by a second tie bar 505. The first and second clip sets are connected together by a third tie bars 505, where the source clip 502 is connected to the source clip 503 through the third tie bar 305. As mentioned above the first clip set and the second clip set are inverted in relation to each other, where the gate clip 501 is parallel to and separated from the source clip 502, and the source clip 503 is parallel to and separated from gate clip 504.

In this embodiment, the gate clip 501 and the gate clip 504 includes some notches depending on the requirement of the actual fabrication of semiconductor devices. For example, the circuit devices may be formed on the first and second semiconductor chips, as such the notches 522 formed on the gate clips 501 and 504 to avoid the electrical contact with these devices. Similarly, the source clips 502 and 503 can also include some notches depending on the requirement of the actual fabrication of semiconductor devices. In the second embodiment of the present invention, the width of the tie bars 505 is less than or equal to the width of the gate clip 501 or clip 504. Through the tie bars 505, the shape of the clip structure becomes S-shaped or reverse S-shaped. Further, protrusions 520 on the edges of the gate clip 501, the source clip 502, the source clip 503 and the gate clip 504 are connecting parts between two adjacent clip frame structures.

Figure 6:
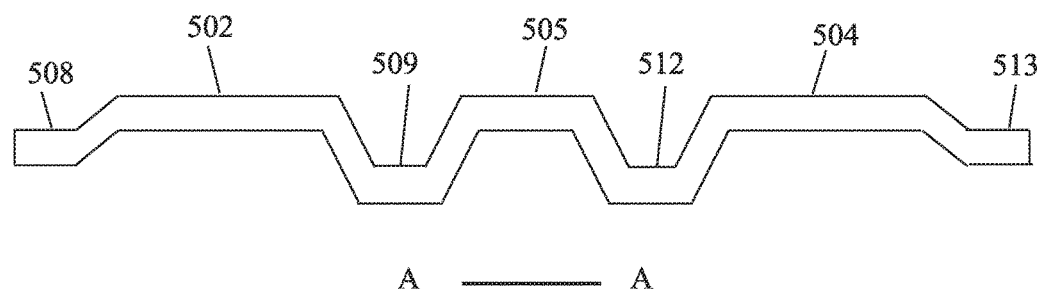
FIG. 6 is a cross-sectional view of the clip structure in FIG. 5 along a line A-A.

FIG. 6 is a cross-sectional view of the clip frame structure of FIG. 5 along a line A-A, specifically is the cross-sectional view of the second clip set including the source clip 502 connected to the gate clip 504 through a connecting bar 505. The source lead contact area 509 located between the source clip 502 and the tie bar 505 is used for connecting to a source lead of the lead frame, and the gate lead contact area 512 located between the tie bar 505 and the gate clip 504 is used for connecting to source lead of the lead frame. The source electrode contact area 508 connected at the outer end of the source clip 502 is used for connecting to a source electrode of a first semiconductor chip, and the gate electrode contact area 513 connected to the outer end of the gate clip 504 is used for connecting to a gate electrode of a second semiconductor chip, which will be described in detail later. The source lead contact area 509 and the gate lead contact area 512 are located in a first plane, and the source and gate electrode contact areas 508 and 513 are located in a second plane, where the first plane of the source lead contact area 509 and the gate lead contact area 512 is lower than the second plane of the source electrode contact area 508 and the gate electrode contact area 513.

The cross-sectional view of the first clip set including the gate clip 501 and the source clip 503 connecting together by a tie bar 505 is similar as that of the second clip set described in FIG. 6. The gate lead contact area 507 located between the gate clip 501 and the tie bar 505 is used for connecting to a gate lead of the lead frame. The source lead contact area 510 located between the tie bar 505 and the source clip 503 is used for connecting to a source lead of the lead frame. The gate electrode contact area 506 connected to the outer end of the gale clip 501 is used for connecting to a gate electrode of the first semiconductor chip. The source electrode contact area 511 connected to the outer end of the source clip 503 is used for connecting to a source electrode of the second semiconductor chip, which will be described in detail later.

Figure 7:
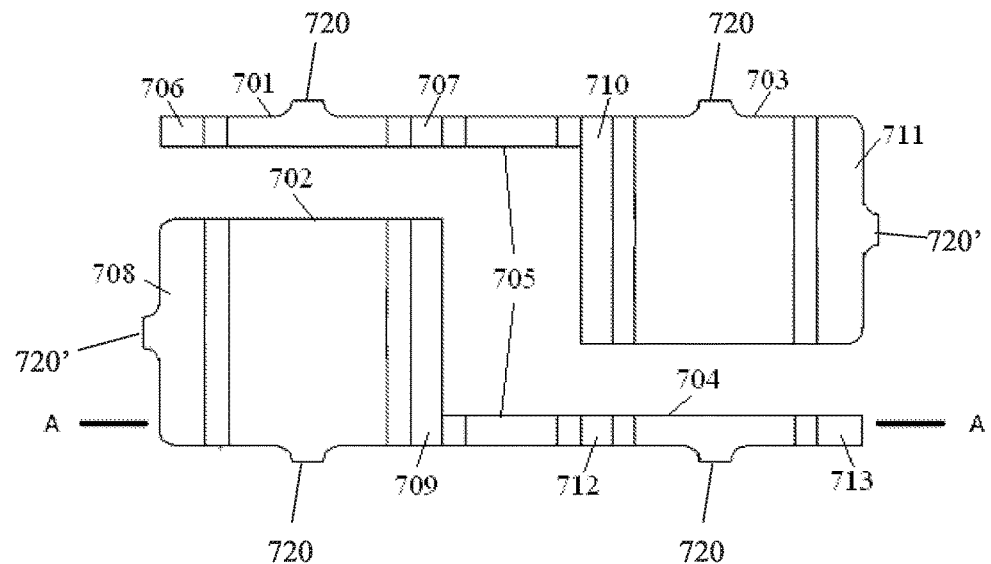
FIG. 7 is a top view of another clip structure according to the third embodiment of the present invention.

FIG. 7 illustrates a top view of another clip frame structure according to a third embodiment of the present invention. The clip frame structure can be made of metal such as copper and includes two identical clip sets placed side by side with one clip set being inverted in relation to the other, thus constituting as a rotational symmetry of order 2 image of each other. The first clip set includes a gate clip 701 and a source clip 703 connected together by a first tie bar 705. The second clip set includes a source clip 702 and a gate clip 704 connected together by a second tie bar 705. In this embodiment, the first and second clip sets are separated from each other without internal connection. As mentioned above the first clip set and the second clip set are inverted in relation to each other, where the gate clip 701 is parallel to and separated from the source clip 702, and the source clip 703 is parallel to and separated from gate clip 704. The width of the tie bars 705 is less than or equal to the width of the gate clip 701 or clip 704. Through the tie bars 705, the overall shape of the clip frame structure is two L-shaped structures mutually inverted to each other. The protrusions 720 on the edges of the gate clip 701, the source clip 702, the source clip 703 and the gate clip 704 are connecting parts between two adjacent clip structures. In addition, since the first and second clip sets are not connected to each other, other protrusions 720' on the edges of the source clip 702 and the source clip 703 are needed for connecting two adjacent clip frame structures.

Figure 8:
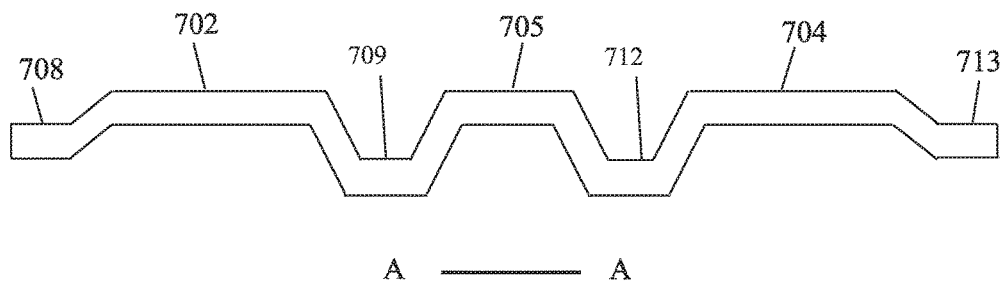
FIG. 8 is a cross-sectional view of the clip structure in FIG. 7 along a line A-A.

FIG. 8 is a cross-sectional view of the clip structure of FIG. 7 along a line A-A, specifically is the cross-sectional view of the second clip set including the source clip 702 connected to the gate clip 704 through a connecting bar 705. The source lead contact area 709 located between the source clip 702 and the tie bar 705 is used for connecting to a source lead of the lead frame, and the gate lead contact area 712 located between the tie bar 705 and the gate clip 704 is used for connecting to a gate lead of the lead frame. The source electrode contact area 708 connected at the outer end of the source clip 702 is used for connecting to a source electrode of a first semiconductor chip, and the gate electrode contact area 713 connected to the outer end of the gate clip 704 is used for connecting to a gate electrode of a second semiconductor chip, which will be described in detail later. The source lead contact area 709 and the gate lead contact area 712 are located in a first plane, and the source and gate electrode contact areas 708 and 713 are located in a second plane, where the first plane of the source lead contact area 709 and the gate lead contact area 712 is lower than the second plane of the source electrode contact areas 708 and the gate electrode contact area 713.

The cross-sectional view of the first clip set including the gate clip 701 and the source clip 703 connecting together by a tie bar 705 is similar as that of the second clip set described in FIG. 8. The gate lead contact area 707 located between the gate clip 701 and the tie bar 705 is used for connecting to a gate lead of the lead frame. The source lead contact area 710 located between the tie bar 705 and the source clip 703 is used for connecting to a source lead of the lead frame. The gate electrode contact area 706 connected to the outer end of the gale clip 701 is used for connecting to a gate electrode of the first semiconductor chip. The source electrode contact area 711 connected to the outer end of the source clip 703 is used for connecting to a source electrode of the second semiconductor chip, which will be described in detail later.

Figure 9:
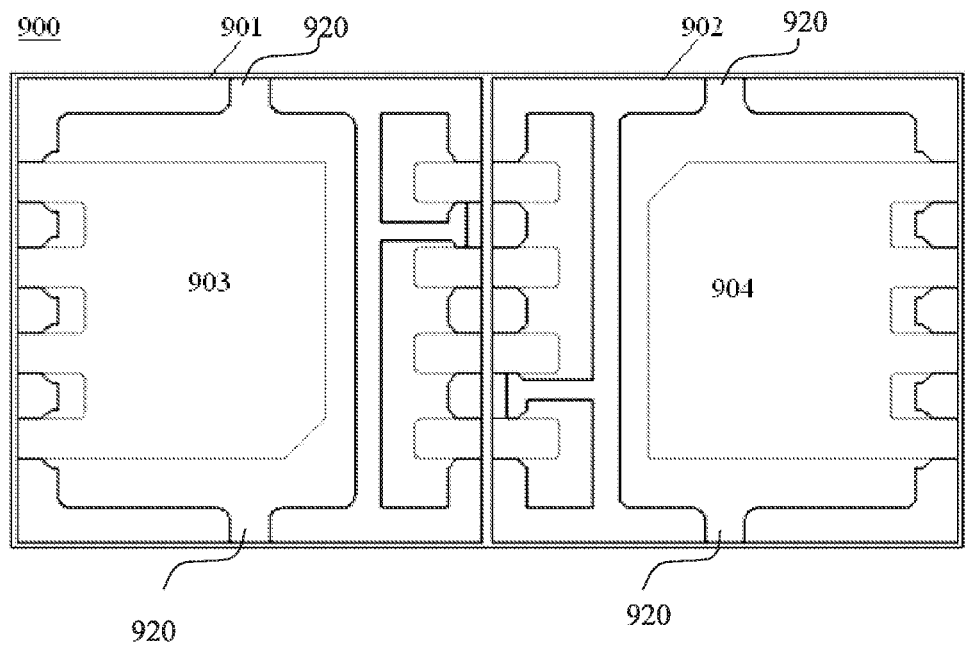
FIG. 9 is a schematic diagram illustrating a top view of a lead frame.

FIGS. 9-13 illustrate a method of manufacturing a semiconductor package with a small gate clip according to an embodiment of the present invention. In the manufacturing process, a lead frame strip includes a plurality of lead frame units connected to each other (not shown). The lead frame can be made of copper with the surface be plated with nickel, silver or gold. As shown in FIG. 9, each group 900 of the lead frame trip includes a first lead frame unit 901 and the second lead frame unit 902, where the second lead frame unit 902 is rotated 180 degrees, or inverted, in relation to the first lead frame unit and is connected to the first lead frame unit 901, thus constituting as a rotational symmetry of order 2 image of each other.

The first frame unit 901 has a first die pad 903 and several leads surrounding the die pad 903, where some of the leads may be connected to the first die pad 903, while others are separated from the die pad 903. Similarly, the second lead frame unit 902 has a second die pad 904 and several leads surrounding the die pad 904, where some of the leads may be connected to the second die pad 904, while others are separated from the die pad 904. In the embodiment shown, a gate lead and a source lead of each lead frame unit are disposed between die pad 903 and die pad 904. Alternatively, die pad 903 and die pad 904 may be disposed between the gate leads and source leads of the two lead frame units (not shown). The lead frame units 901 and 902 also include a plurality of protrusions 920 formed at the edges of the die pads 903 and 904, which are used for connecting the adjacent lead frame units during mass production.

Figure 10:
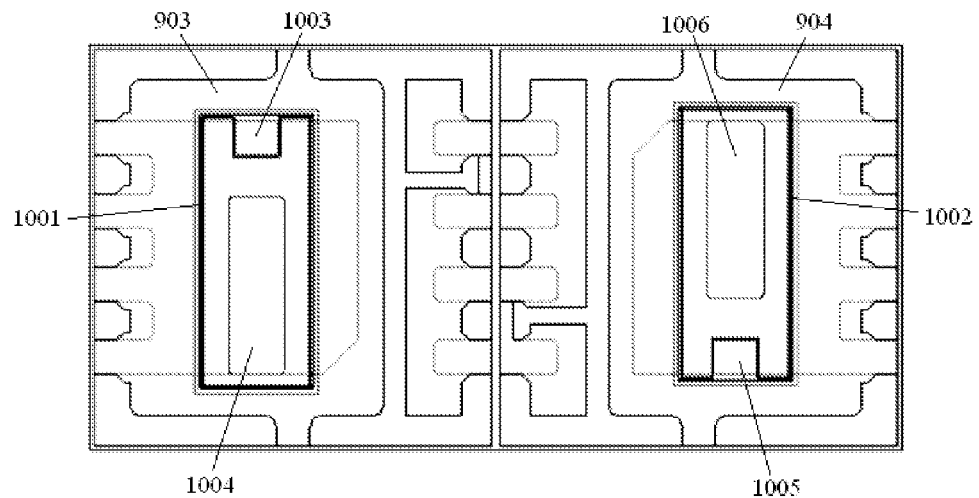
FIG. 10 is a schematic diagram illustrating the chips mounted on the lead frame.

As shown in FIG. 10, the first semiconductor chip 1001 and the second semiconductor chip 1002, which preferably are two identical vertical power transistors, such as MOSFETs, or IGBTs, each having a gate and a source electrode disposed at its top surface and a drain electrode at it bottom surface, are attached on the die pads 903 and 904 respectively. The first semiconductor chip 1001 is attached on die pad 903 of the lead frame unit 901, where the drain at the bottom surface of the first chip 1001 (not shown) is attached on the die pad 903, while both the gate electrode 1003 and the source electrode 1004 of chip 1001 are formed at the top surface of the first chip 1001. The second chip 1002, which is the same as the chip 1001, is rotated 180 degrees related to the first chip 1001 and then attached on the die pad 904 of the lead frame unit 902. The source electrode 1006 and the gate electrode 1005 of chip 1002 are formed at the top surface of the second chip 1002 and the drain electrode at the bottom of chip 1002 (not shown) is attached on the die pad 904 of the second lead frame unit 902. As mentioned above, the second chip 1002 attached on the die pad 904 is rotated 180 degrees in relation to the first chip 1001 attached on the die pad 903, the lead frame unit 901 with the first chip 1101 attached thereon and the lead frame unit 902 with the second chip 1102 attached thereon constitute as a rotational symmetry of order 2 image of each other.

Figure 11A:
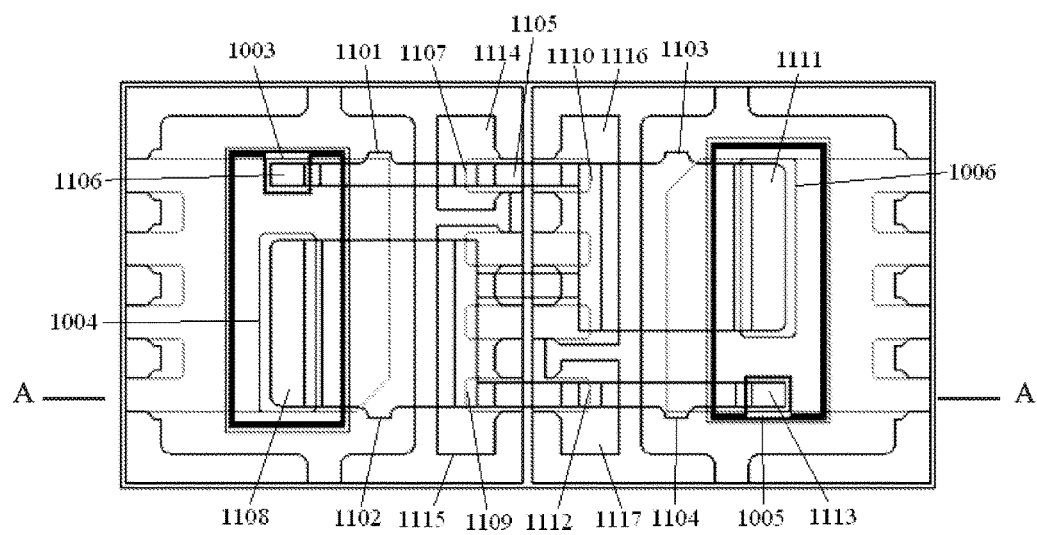
FIGS. 11A-11B are top view and cross-sectional view of the clip frame mounted on chips in the structure of FIG. 10.
Figure 11B:
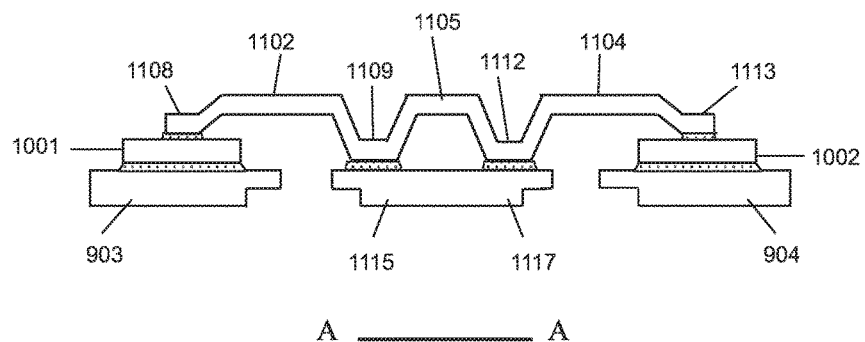

As illustrated in FIGS. 11A-11B, a clip frame structure of the type depicted in FIG. 3, including a first clip set and a second clip set, is attached on the first and second chips 1101 and 1102. The first clip set includes a gate clip 1101 and a source clip 1103 connected together by a first tie bar 1105. The second clip set includes a source clip 1102 and a gate clip 1104 connected together by a second tie bar. The source clip 1103 of the first clip set and the source clip 1102 of the second clip set are connected together by a third tie bar. The gate lead contact area 1107 located between the gate clip 1101 and the first tie bar 1105 is attached to a gate lead 1114 of the lead frame unit 901, while a gate electrode contact area 1106 connected to the outer end of the gate clip 1101 is connected to the gate electrode 1003 of the first chip 1001.

The source lead contact area 1109 located between the source clip 1102 and the second tie bar 1105 is attached on the source lead 1115 of the first lead frame unit 901, while the source electrode contact area 1108 connected to the outer end of the source clip 1102 is attached on the source electrode 1004 of the first chip 1001.

The source lead contact area 1110 located between the source clip 1103 and the tie bar 1105 is connected to a source lead 1116 of the second lead frame unit 902, while the source electrode contact area 1111 located at the outer end of the source clip 1103 is connected to the source electrode 1006 of the second chip 1002. The gate lead contact area 1112 located between the gate clip 1104 and the tie bar 1105 is connected to a gate lead 1117 of the second lead frame unit 902, while the gate electrode contact area 1113 located at the outer end of the gate clip 1104 is connected to the gate electrode 1005 of the second chip 1002.

In the embodiment shown, a gate lead 1114, 1117 and a source lead 1115, 1116 of each lead frame unit are disposed between die pad 903 and die pad 904. Alternatively, die pad 903 and die pad 904 may be disposed between the gate leads and source leads of the two lead frame units (not shown). In this case, the locations of the source lead contact area and the source electrode contact area in each source clip should be switched and the locations of the gate lead contact area and gate electrode contact area in each gate clip should be switched.

Figure 12A:
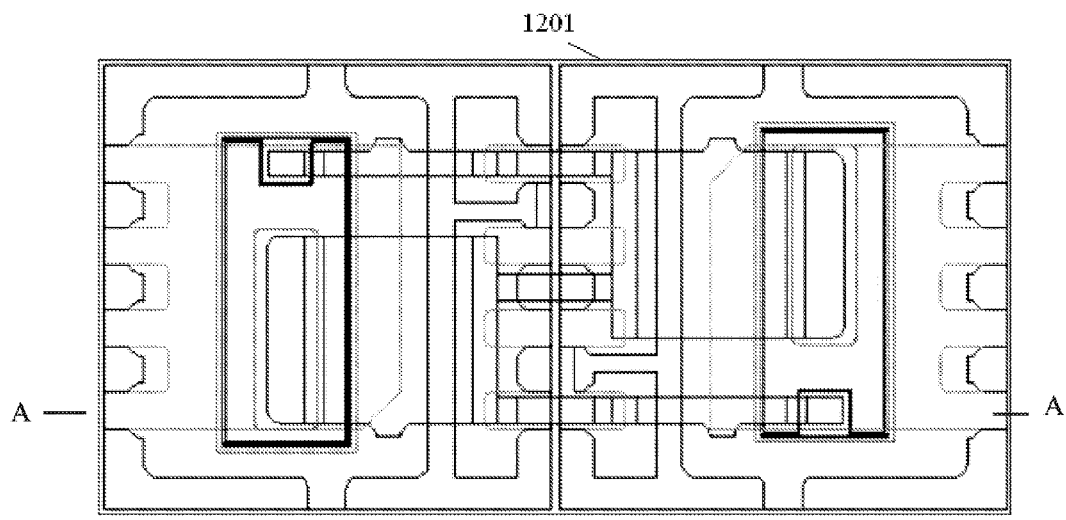
FIGS. 12A-12B are top view and cross-sectional view of the packaging process of the structure of FIGS. 11A-11B.
Figure 12B:
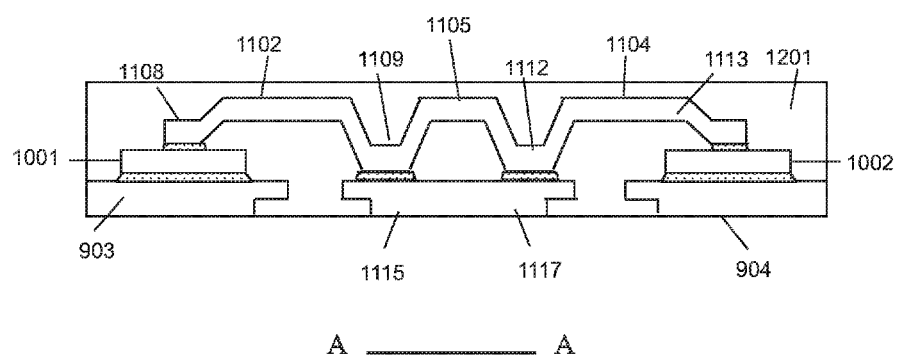
Figure 13A:
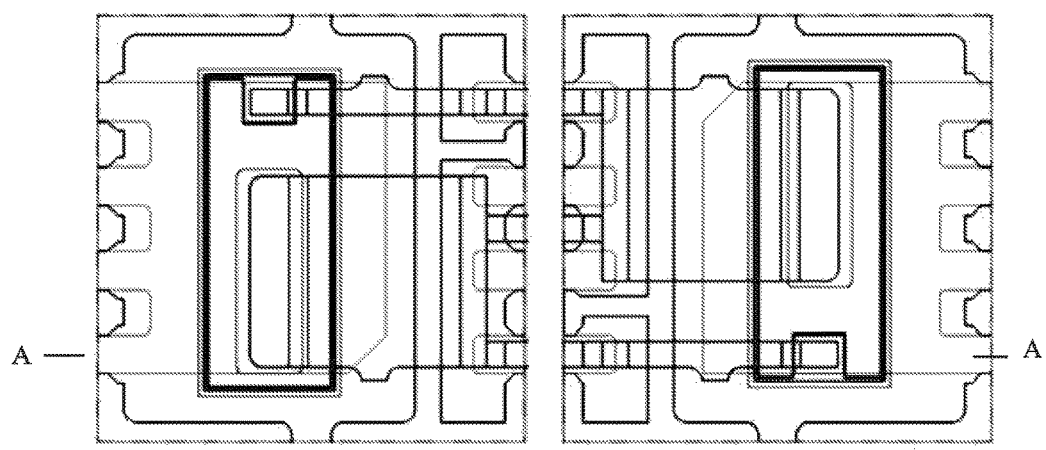
FIGS. 13A-13B are top view and cross-sectional view of the cutting process of the structure of FIGS. 12A-12B.
Figure 13B:
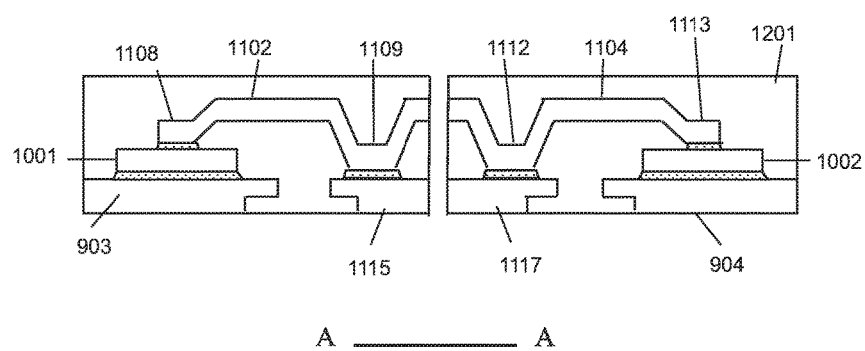

As shown in FIGS. 12A-12B, the structure of FIG. 11 comprising of the clip structure, semiconductor chips and lead frame units is then encapsulated by a packaging layer 1201. As shown in FIGS. 13A-13B, after the packaging step, individual semiconductor devices are singulated by cutting through the molding layer and the lead frame across the tie bars 1105. In an alternative embodiment, the clip structure can be modified such that the source clips 1102 and 1103 are in a plane higher that the plane of the tie bars 1105 and the gate clips 1101 and 1104, as such the source clips 1102 and 1103 can be exposed out of the molding layer 1201 for heat dissipation (not shown).

Figure 14:
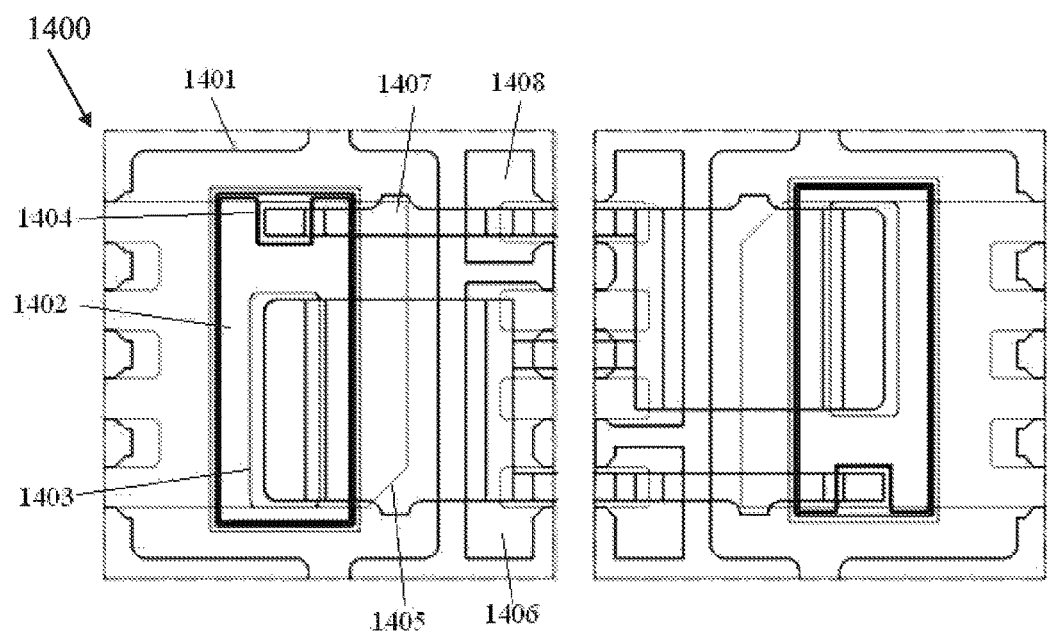
FIG. 14 is a schematic diagram of complete packages with a small gate clip structure of the present invention.

FIG. 14 illustrates two adjacent semiconductor packages with a small gate clip of the present invention, where one package is completely the same and is rotated 180 degrees in relation to the other. As shown in FIG. 14, each semiconductor package comprises a lead frame unit 1400 preferably made of copper and having the surface plated with nickel, silver or gold. The lead frame unit 1400 includes a die pad 1401 and a plurality of leads surrounding the die pad. A plurality of protrusions is formed on the edges of the lead frame unit for connecting the neighboring lead frame units together in a lead frame strip. A semiconductor chip 1402 is attached on the die pad 1401, which includes a source electrode 1403 and a gate electrode 1404 on the top surface. One end of a source clip 1405 is mounted on the source electrode 1403 of the chip 1402 and the other end is mounted on a source lead 1406 of the lead frame unit 1400. One end of a gate clip 1407 is mounted on the gate electrode 1404 of the chip 1402, and the other end is mounted on a gate lead 1408 of the lead frame unit 1400. The source lead 1406 and gate lead 1408 are separated from the die pad 1401 of lead frame 1400. Lead frame unit 1400, the chip 1402, source clip 1405 and gate clip 1407 are encapsulated with a packaging layer used for the protection of the whole semiconductor device.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A semiconductor package comprising:
   a lead frame having a die pad;
   a semiconductor chip having a top surface and a bottom surface; the bottom surface of the semiconductor chip being directly attached to a top surface of the die pad; the top surface of the semiconductor chip having a gate electrode and a source electrode; and the bottom surface of the semiconductor chip having a drain electrode;
   a gate lead;
   a metal gate clip having a first end bottom surface, a mid-range bottom surface and a second end side surface; the first end bottom surface of the metal gate clip being directly attached to the gate electrode of the semiconductor chip; and the mid-range bottom surface of the metal gate clip being directly attached to the gate lead;
   a molding encapsulation covering a top surface of the lead frame and enclosing the semiconductor chip, at least a majority portion of the gate lead and at least a majority portion of the metal gate clip;
   wherein the second end side surface of the metal gate clip is exposed from the molding encapsulation; and
   wherein the mid-range bottom surface of the metal gate clip is located at a height lower than the first end bottom surface and the second end side surface of the metal gate clip.

2. The semiconductor package of claim 1, wherein the second end side surface of the metal gate clip is co-planar with a side surface of the molding encapsulation.

3. The semiconductor package of claim 1 further comprising a source lead;
   a metal source clip having a first end bottom surface, a mid-range bottom surface and a second end side surface; the first end bottom surface of the metal source clip being directly attached to the source electrode of the semiconductor chip; and the mid-range bottom surface of the metal source clip being directly attached to the source lead;
   wherein the molding encapsulation encloses at least a majority portion of the metal source clip; and
   wherein the second end side surface of the metal source clip is exposed from the molding encapsulation.

4. The semiconductor package of claim 3, wherein the second end side surface of the metal source clip is co-planar with a side surface of the molding encapsulation.

5. The semiconductor package of claim 3, wherein the second end side surface of the metal gate clip contacts a second end side surface of an other metal source clip of an other semiconductor package to form a first contacted metal clip;
   wherein the second end side surface of the metal source clip contacts a second end side surface of an other metal gate clip of the other semiconductor package to form a second contacted metal clip; and
   wherein the first contacted metal clip is a rotational symmetry of order 2 image of the second contacted metal clip.

* * * * *